United States Patent
Chou et al.

(10) Patent No.: US 8,982,636 B2
(45) Date of Patent: Mar. 17, 2015

(54) ACCESSING METHOD AND A MEMORY USING THEREOF

(71) Applicant: Macronix International Co., Ltd., Hsinchu (TW)

(72) Inventors: Tsung-Yi Chou, Hsinchu County (TW); Ming-Feng Zhou, Taipei County (TW); Chung-Yi Li, Pingtung County (TW); Zong-Qi Zhou, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 152 days.

(21) Appl. No.: 13/858,134

(22) Filed: Apr. 8, 2013

(65) Prior Publication Data

US 2013/0194866 A1 Aug. 1, 2013

Related U.S. Application Data

(63) Continuation-in-part of application No. 12/500,826, filed on Jul. 10, 2009, now abandoned.

(51) Int. Cl.
*G11C 11/4197* (2006.01)
*G11C 16/34* (2006.01)
*G11C 16/10* (2006.01)
*G11C 7/16* (2006.01)
*G11C 11/56* (2006.01)

(52) U.S. Cl.
CPC .... *G11C 16/34* (2013.01); *G11C 7/16* (2013.01); *G11C 11/5628* (2013.01); *G11C 11/5642* (2013.01); *G11C 16/10* (2013.01); *G11C 16/3454* (2013.01); *G11C 2211/5621* (2013.01); *G11C 2211/5634* (2013.01)

USPC ........... 365/185.21; 365/185.03; 365/185.22; 365/184; 365/189.15; 365/189.07; 365/189.16; 365/208

(58) Field of Classification Search
USPC ........... 365/184, 189.15, 189.16, 189.07, 208
See application file for complete search history.

(56) References Cited

U.S. PATENT DOCUMENTS

| | | | | |
|---|---|---|---|---|
| 6,396,741 B1 * | 5/2002 | Bloom et al. | ............ | 365/185.22 |
| 6,477,084 B1 * | 11/2002 | Eitan | ............ | 365/185.18 |
| 6,490,204 B2 * | 12/2002 | Bloom et al. | ............ | 365/185.28 |
| 7,508,713 B2 * | 3/2009 | Sekar et al. | ............ | 365/185.18 |
| 7,813,172 B2 * | 10/2010 | Cernea | ............ | 365/185.03 |
| 7,830,707 B2 | 11/2010 | Chang et al. | | |
| 2006/0062054 A1 | 3/2006 | Hamilton et al. | | |
| 2008/0080251 A1 | 4/2008 | Chang et al. | | |
| 2008/0285354 A1 | 11/2008 | Park et al. | | |
| 2009/0310419 A1 * | 12/2009 | Cernea | ............ | 365/185.19 |
| 2010/0214841 A1 | 8/2010 | Chou | | |
| 2010/0254194 A1 | 10/2010 | Chou et al. | | |

* cited by examiner

*Primary Examiner* — Hoai V Ho
*Assistant Examiner* — Jay Radke
(74) *Attorney, Agent, or Firm* — McClure, Qualey & Rodack, LLP

(57) ABSTRACT

A memory comprises a memory cell, a sense amplifier, and a control unit. The memory cell stores a first bit and a second bit. The sense amplifier senses a first cell current and a second cell current corresponding to the first and the second bits respectively with a voltage applying on the memory cell. The control unit determines a digital state of the first bit by comparing a first reference current with the first cell current or by comparing a reference data with a first delta current between the first cell current and the second cell current.

20 Claims, 6 Drawing Sheets

US 8,982,636 B2

ACCESSING METHOD AND A MEMORY USING THEREOF

The is a continuation-in-part application of U.S. patent application Ser. No. 12/500,826, filed on Jul. 10, 2009, now abandoned, which is entirely incorporated by reference.

BACKGROUND OF THE INVENTION

1. Field of the Invention

The invention relates in general to an accessing method for a memory, and more particularly to an accessing method for a memory with multi-bit cells.

2. Description of the Related Art

Along with increasing development of technology, non-volatile memory, such as flash memory, has been wildly used in electronic product. For example, a flash memory includes a number of memory cells, each of which stores a bit of data. Each of the memory cells corresponds with a programmable threshold voltage indicating a logic value of the bit of data.

Referring to FIG. 1, an illustration for threshold voltages distribution of a conventionally flash memory is shown. For example, a reference voltage PV is applied as a judging criterion. Bits of data corresponding to threshold voltages smaller than the reference voltage PV, as shown as a group of bits of data A, are programmed with a low-threshold-voltage state. It is determined that the bits of data in group A indicate logic value "1". Bits of data corresponding to threshold voltages greater than the reference voltage PV, as shown as a group of bits of data B, are programmed with a high-threshold-voltage state. It is determined that the bits of data in group B indicate logic value "0".

In the conventionally flash memory, the bits of data in the group B must be programmed with threshold voltages higher than the reference voltage PV and the reference voltage PV must be higher than a highest threshold voltage Vthl_h, which indicates the highest threshold voltage corresponding to the bits of data in the group A, by a margin, otherwise the conventionally flash memory cannot be properly read. Therefore, a reference voltage with high voltage level, a great number of program shots, and a great period of program time are disadvantageously needed for the conventionally flash memory.

SUMMARY OF THE INVENTION

The invention is directed to an accessing method for a memory with a number of memory cells, each of which is capable of storing two bits of data. The accessing method according to the invention applies lower reference voltage PV in program operation. Furthermore, the accessing method according to the invention can effectively read the data stored in the memory even if the distribution of memory cells with high-threshold-voltage state and that of the memory cells with low-threshold-voltage state are substantially overlapped with each other. Thus, in comparison with the conventional accessing method, the accessing method according to the invention can effectively reduce the program shots and shorten the corresponding program time.

According to a first aspect of the present invention, a memory, which comprises a memory array, a first operation circuit, and a second operation circuit, is provided. The memory array includes a memory cell for storing a first bit and a second bit. The first operation circuit has the first and the second bits programmed with substantially the same initial threshold voltage state to a final threshold voltage state by applying a same number of operating shots. The second operation circuit includes a sense amplifier and a control unit. The sense amplifier senses a first cell current and a second cell current corresponding to the first and the second bits respectively. The control unit determines a digital state of the first bit by comparing a reference data with a first delta current between the first cell current and the second cell current.

According to a second aspect of the present invention, a memory, which includes a memory cell, a sense amplifier and a control unit, is provided. The memory cell stores a first bit and a second bit. The sense amplifier senses a first cell current and a second cell current corresponding to the first and the second bits, respectively, by applying a voltage on the memory cell. The control unit determines a digital state of the first bit by comparing a first reference current with the first cell current or by comparing a reference data with a first delta current between the first cell current and the second cell current.

The invention will become apparent from the following detailed description of the preferred but non-limiting embodiments. The following description is made with reference to the accompanying drawings.

DETAILED DESCRIPTION OF THE INVENTION

The accessing method according to the present embodiment of the invention applies the information of whether a first cell current and a second cell current, which correspond with a first bit of data and a second bit of data respectively stored in a memory cell of a memory, are substantially close to each other to determine the programmed state of the first and the second bits of data.

Figure 1:
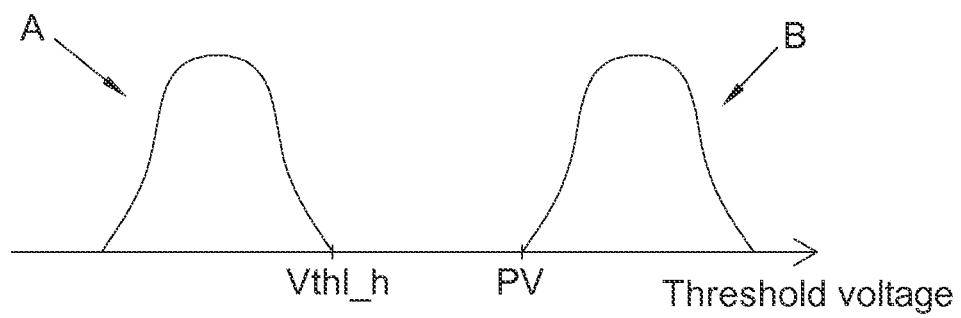
FIG. 1 (Prior Art) is an illustration for threshold voltages distribution of a conventionally flash memory.
Figure 2:
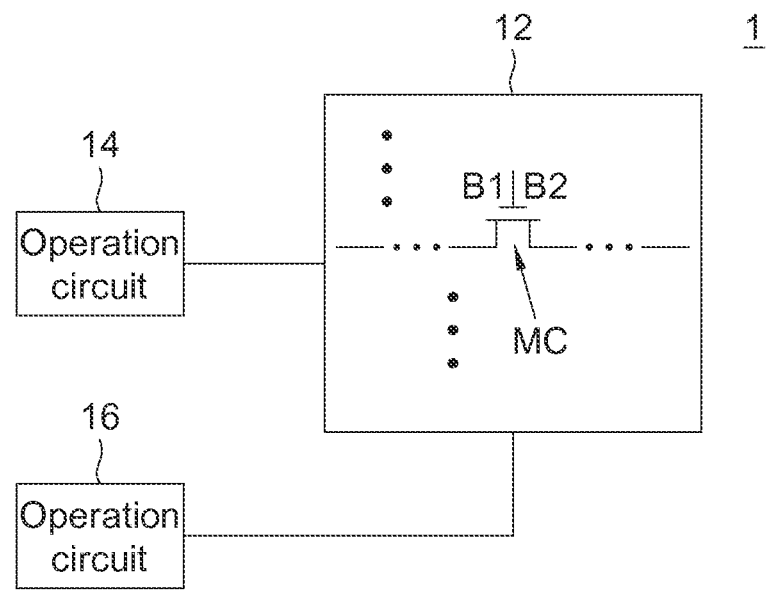
FIG. 2 is a block diagram of a memory according to the present embodiment of the invention.

Referring to FIG. 2, a block diagram of a memory according to the present embodiment of the invention is shown. The memory 1, a flash memory for example, includes a memory array 12, operation circuits 14 and 16. The memory array 12 includes numerous memory cells, each of which stores two bits of data. The operation circuit 16 is, for example, a read circuit for reading data stored in the memory array 12. The operation circuit 14, which is a program circuit, for example, programs the memory cells for storing those bits of data. For example, the bits of data stored in each of the memory cells can be programmed to have a high-threshold-voltage state indicating a logic value 0 or can be programmed to have a low-threshold-voltage state indicating a logic value 1.

Figure 3A:
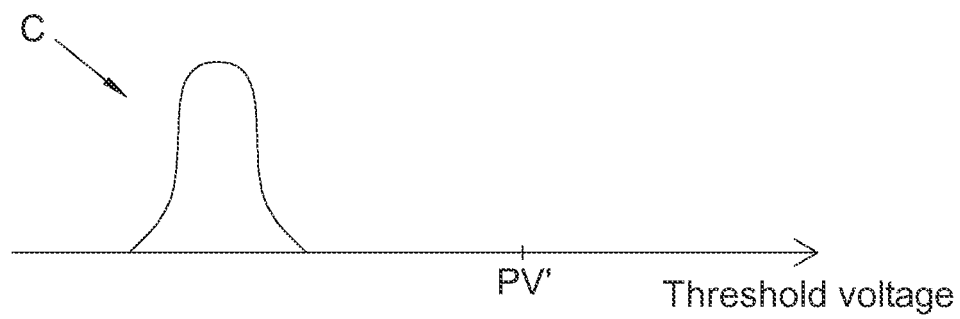
FIG. 3A is an illustration of an initial threshold voltages distribution of the memory array 12.

Referring to FIG. 3A, an illustration of an initial threshold voltages distribution of the memory array 12 is shown. For example, all of the bits of data are initiated to have an initial state C, in which the threshold voltages corresponding to the bits of data are all smaller than a reference voltage PV'. For each of the memory cells, the initial threshold voltages corresponding to the two bits of data stored in each of the memory cells are close to each other. In an example, for each of the memory cells, the two bits of data stored therein correspond to a same initial threshold voltage. Furthermore, for each of the memory cells, the two bits of data are included in a same program block. In other words, a same number of program shots are applied by the operation circuit 14 to the two bits of data stored in each of the memory cells when the two bits of data are about to be programmed to have the high-threshold-voltage state. Thus, when the two bits of data stored in each of the memory cells are programmed to be the same state (either the low-threshold-voltage state or the high-threshold-voltage state), the two bits of data correspond to substantially the same threshold voltages.

Figure 3B:
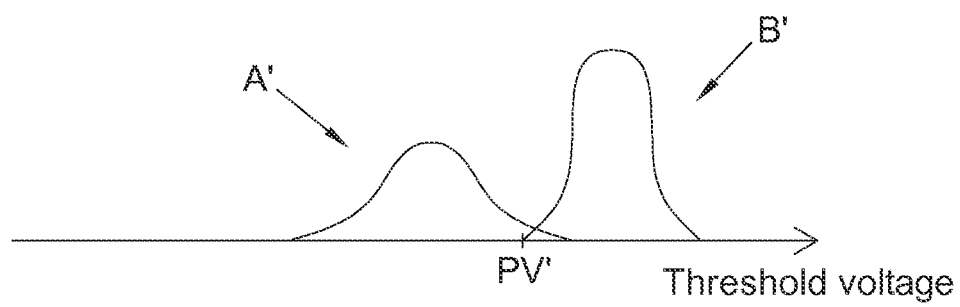
FIG. 3B is an illustration of a programmed threshold voltages distribution of the memory array 12.

Referring to FIG. 3B, an illustration for a programmed threshold voltages distribution of the memory array 12 is shown. The threshold voltages corresponding to the bits of data having the high-threshold-voltage state are programmed to be greater than a reference voltage PV'. For example, after the program operation performed by the operation circuit 14, a group of bits of data B' corresponding to the high-threshold-voltage state are formed. The threshold voltages corresponding to the group of bits of data B' are greater than the reference voltage PV'.

Other than the group B', the rest of the bits of data are not programmed so as to form a group of bits of data A' corresponding to the low-threshold-voltage state. Most of those bits of data in group A' correspond to threshold voltages smaller than the reference voltage PV'. Some bits of data in group A' correspond to threshold voltages, which are raised to be greater than the reference voltage PV' due to the second-bit effect. In other words, a bit of data having the high-threshold-voltage state is stored in memory cells storing the respective bits of data in group A' corresponding to threshold voltages greater than the reference voltage PV'. That is to say those bits of data in group A' corresponding to threshold voltages greater than the reference voltage PV' are stored in memory cells with data indicating the two logic values 1 and 0.

Thus, judging criteria must be applied by the operation circuit 16 to effectively read those bits of data, which have the low-threshold-voltage state but correspond to threshold voltages greater than the reference voltage PV'. In an example, the cell currents corresponding to the two bits of data stored in a memory cell are applied by the operation circuit 16 to spot those bits of data having the low-threshold-voltage state but correspond to threshold voltages greater than the reference voltage PV'. Since the read operation performed on those memory cells are substantially the same, only the read operation performed on a memory cell MC is cited as an example in the following paragraphs. For example, the memory cell MC storing a first bit of data B1 and a second bit of data B2.

Figure 4:
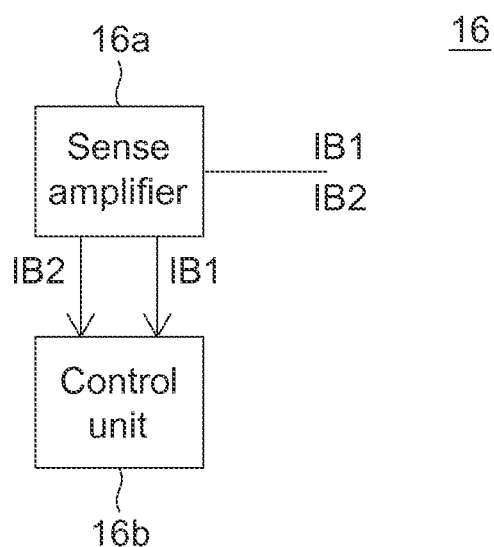
FIG. 4 is a detail block diagram of the read circuit according to the present embodiment of the invention.

Referring to FIG. 4, a detail block diagram of the operation circuit 16 according to the present embodiment of the invention is shown. The operation circuit 16 includes a sense amplifier 16a and a control unit 16b. The sense amplifier 16a senses first cell current IB1 and second cell current IB2 corresponding to the first and the second bits of data B1 and B2 respectively.

In the operation for reading the first bit of data B1, the control unit 16b determines whether the first cell current IB1 is greater than a reference current to determine whether the threshold voltage corresponding to the first bit of data B1 is greater than the reference voltage PV'. If the first cell current IB1 is greater than the reference current (indicating the threshold voltage corresponding to the first bit of data B1 is not greater than the reference voltage PV'), the first bit of data B1 must be programmed to have the low-threshold-voltage state. Thus, the control unit 16b determines that the first bit of data B1 indicates the logic value 1 if the first cell current IB1 is greater than the reference current (that is the threshold voltage corresponding to the first bit of data B1 is not greater than the reference voltage PV').

If the first cell current IB1 is not greater than the reference current (indicating the threshold voltage corresponding to the first bit of data B1 is greater than the reference voltage PV'), the first bit of data B1 may be programmed to have the low-threshold-voltage state or the high-threshold-voltage. The control unit 16b further determines whether a first delta current between the first cell current IB1 and the second cell current IB2 is greater than reference data to determine whether the first and the second bits of data B1 and B2 respectively indicating the logic values 1 and 0. For example, the first delta current is obtained by subtracting the second cell current IB2 from the first cell current IB1. Thus, whether the first bit of data B1 is one of those bits of data having the low-threshold-voltage state but correspond to threshold voltages greater than the reference voltage PV' can be determined.

For example, the reference data is chosen based on an average difference between the two cell currents corresponding to the two bits of data with logic values 0 and 0 stored in each memory cell of the memory array 12 and that with logic values 0 and 1 measured in an experiment. In an example, the average difference corresponding to the two bits of data with logic values 0 and 0 has the value of 0.875 micro-ampere ($\mu A$) and the average difference corresponding to the two bits of data with logic values 0 and 1 has the value of 15.063 $\mu A$. The reference data are set based on the average value of the two average differences (0.875 and 15.063 $\mu A$). In other words, the reference data has the value of 7.968 $\mu A$.

If the first delta current is greater than the reference data, it is suggested that the first and the second bits of data B1 and B2 respectively indicate the logic values 1 and 0 and the first bit of data B1 is one of those bits of data in group A' but corresponding to a threshold voltage greater than the reference voltage PV'. Thus, the control unit 16b accordingly determines that the first bit of data B1 indicates the logic value 1 if the first delta current is greater that the reference data.

If the first delta current is not greater than the reference data, it is suggested that the first and the second bits of data B1 and B2 are not respectively indicate the logic values 1 and 0 and the first bit of data B1 is not one of those bits of data in group A' but corresponding to a threshold voltage greater than the reference voltage PV'. It is suggested that the first bit of data B1 is one of those bits of data in group B'. Thus, the control unit 16b accordingly determines that the first bit of data B1 indicates the logic value 0 if the first delta current is not greater that the reference data. Therefore, the first bit of data B1 stored in the memory cell MC can be effectively read.

In the operation for reading the second bit of data B2, the operation circuit 16 performs similar operation as that shown above to determine whether the second cell current IB2 is greater than the reference current (to accordingly determine whether the threshold voltage corresponding to the second bit of data B2 is not greater than the reference voltage PV') and whether a second delta current, which is obtained by subtracting the first cell current IB1 from the second cell current IB2, is greater than the reference data. Therefore, the second bit of data B2 stored in the memory cell MC can be effectively read.

Figure 5:
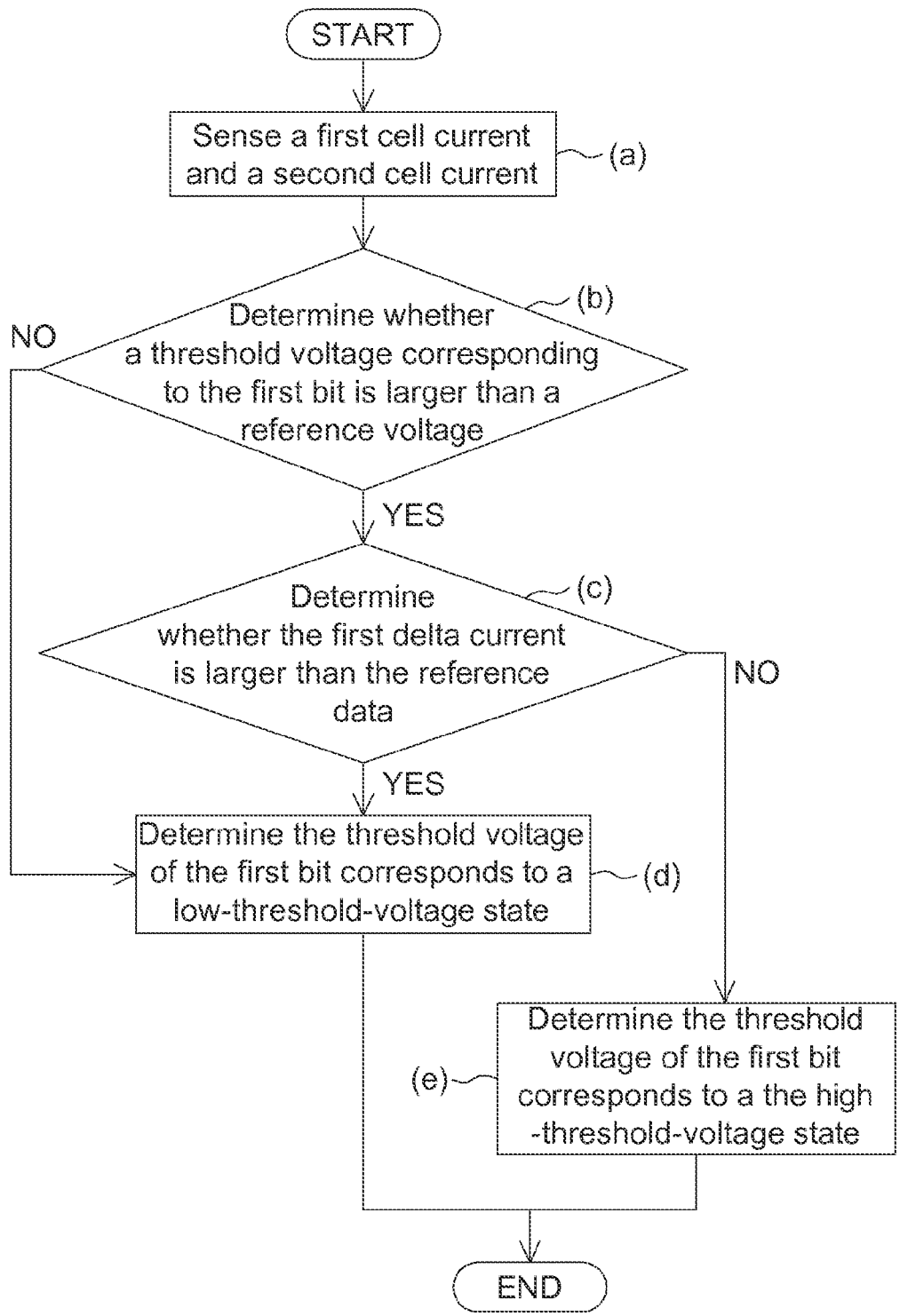
FIG. 5 is a flow chart of the accessing method according to the present embodiment of the invention.

Referring to FIG. 5, a flow chart of the accessing method according to the present embodiment of the invention is shown. The accessing method includes the following steps. First, as shown in step (a), the sense amplifier 16a senses the first cell current IB1 and the second cell current IB2 corresponding to the first and the second bits of data B1 and B2 respectively. Next performing step (b), the control unit 16b determines whether the first cell current IB1 is greater than the reference current to determine whether the threshold voltage corresponding to the first bit of data B1 is greater than the reference voltage PV'. Next performing step (c), the control unit 16b further determines whether the first delta current, which is obtained by subtracting the second cell current IB2 from the first cell current IB1, is greater than the reference data.

If the first delta current is greater than the reference data and the threshold voltage corresponding to the first bit of data B1 is greater than the reference voltage PV', step (d) is performed such that the operation circuit 16 determines the first bit of data B1 corresponds to the low-threshold-voltage state. If the first delta current is not greater than the reference data, step (e) is performed such that the operation circuit 16 determines the first bit of data B1 corresponds to the high-threshold-voltage state.

If the first cell current IB1 is greater than the reference current (indicating the threshold voltage corresponding to the first bit of data B1 is not greater than the reference voltage), step (d) is also performed such that the operation circuit 16 determines the first bit of data B1 corresponds to the low-threshold-voltage state.

Figure 6:
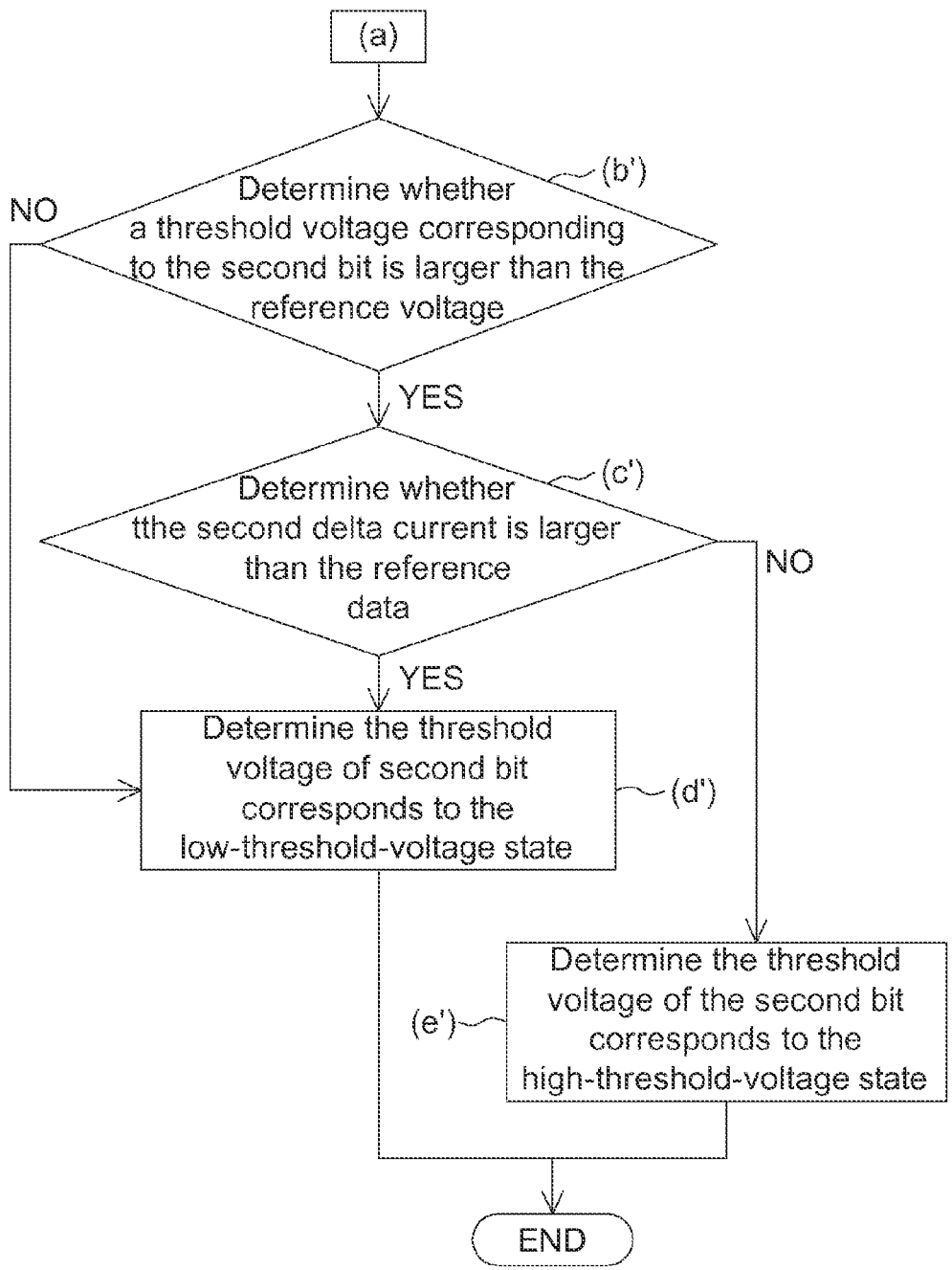
FIG. 6 is a flow chart of the accessing method according to the present embodiment of the invention.

The steps shown in FIG. 5 are for determining the first bit of data B1 and the steps for determining the second bit of data B2 is shown in FIG. 6. After step (a), step (b') is performed such that the control unit 16b determines whether the second cell current IB2 is greater than the reference current to determine whether the threshold voltage corresponding to the second bit of data B2 is greater than the reference voltage PV'. Next, step (c') is performed such that the control unit 16b determines whether the second delta current, which is obtained by subtracting the first cell current IB1 from the second cell current IB2, is greater than the reference data.

If the second delta current is greater than the reference data and the threshold voltage corresponding to the second bit of data B2 is greater than the reference voltage PV', step (d') is performed such that the operation circuit 16 determines the second bit of data B2 corresponds to the low-threshold-voltage state. If the second delta current is not greater than the reference data, step (e') is performed such that the operation circuit 16 determines the second bit of data B2 corresponds to the high-threshold-voltage state.

If the second cell current IB2 is greater than the reference current (indicating the threshold voltage corresponding to the first bit of data B1 is not greater than the reference voltage), step (d) is also performed such that the operation circuit 16 determines the first bit of data B1 corresponds to the low-threshold-voltage state.

Figure 7:
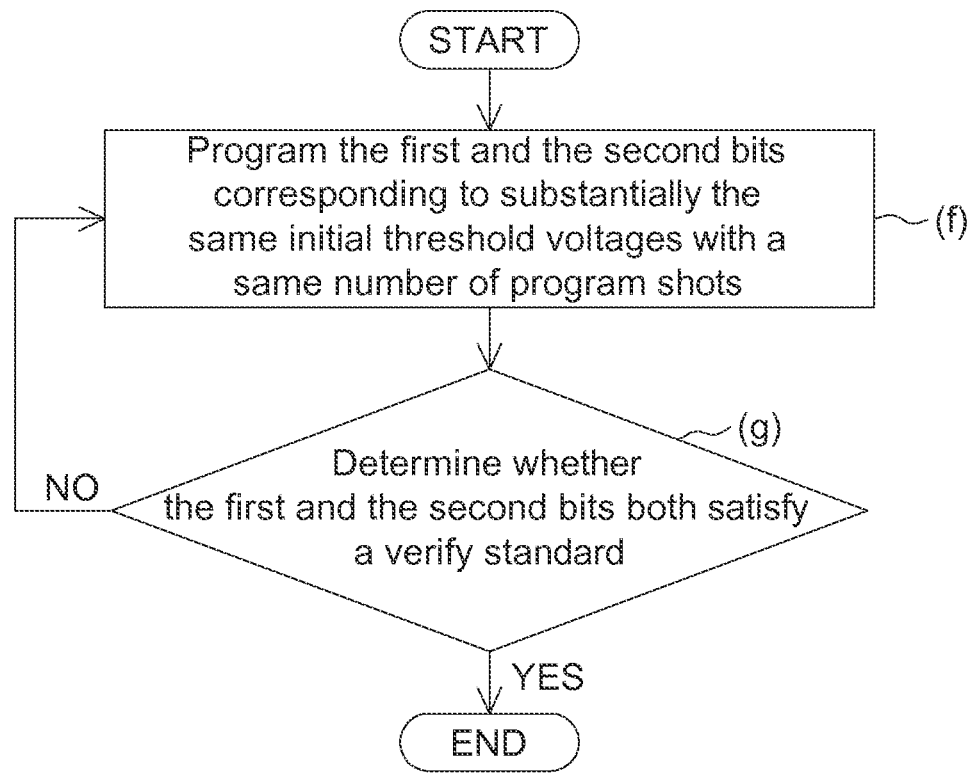
FIG. 7 is a program method according to the present embodiment of the invention.

Referring to FIG. 7, a program method according to the present embodiment of the invention is shown. The program method includes the following steps. First, as shown in step (f), the operation circuit 14 programs the first and the second bits of data B1 and B2, which correspond to close initial threshold voltages, with a same number of program shots when the first and the second bits of data B1 and B2 are both about to be programmed with a high-threshold-voltage state. Then performing step (g), the operation circuit 14 further determines whether the first and the second bits of data b1 and b2 both satisfy a verify standard, if not, repeat step (f) to re-program the first and the second bits of data B1 and B2.

Figure 8:
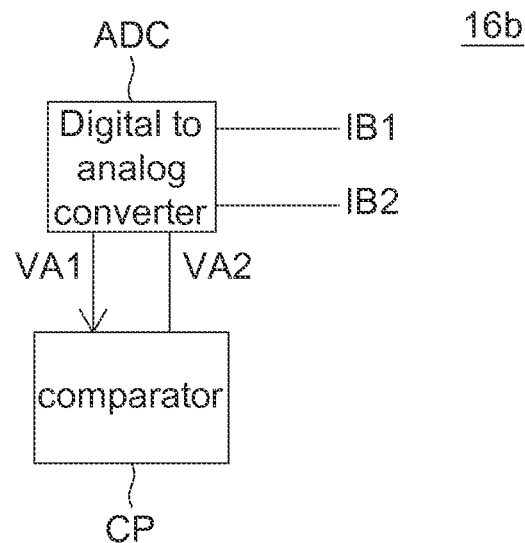
FIG. 8 is a detailed block diagram of the control circuit 16b of FIG. 4.

Referring to FIG. 8, a detailed block diagram of the control unit 16b of FIG. 4 is shown. For example, the control unit 16 comprises a digital to analog converter ADC and a comparator CP. The digital to analog converter ADC converts the first and the second cell currents IB1 and IB2 to a first digital value VA1 and a second digital value VA2 respectively. The comparator CP determines the first delta current by comparing the first and the second digital values VA1 and VA2. The comparator CP further determines the second delta current by comparing the first and the second digital values VA1 and VA2.

Figure 9:
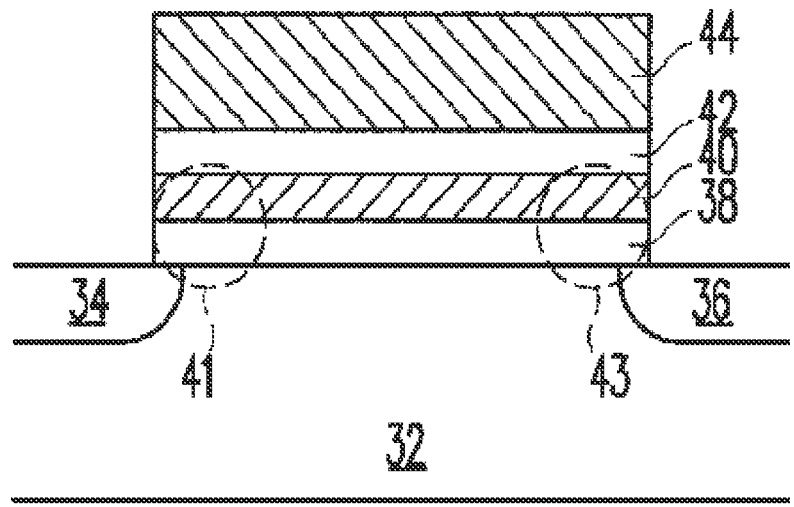
FIG. 9 (prior art) is a sectional view of a memory cell according to the prior art.

Please refer to FIG. 9, which is a sectional view of a prior art memory cell 30. The memory cell is applicable to the embodiments of the application. The memory cell 30 is for example a charging trapping memory cell. The memory cell 30 includes a substrate 32, a source 34, a drain 36, isolation layers 38 and 42, a charge trapping layer 40 and a conductive gate 44. The substrate 32 has two buried PN junctions, one between the source 34 and substrate 32, and the other between the drain 36 and the substrate 32. A channel is between the source 34 and the drain 36. The bottom isolation layer 38 of the memory cell 30 is formed over the channel. The charge trapping layer 40 is formed on top of the bottom isolation layer 38 and is electrically isolated from the substrate 32 by the bottom isolation layer 38. Hot injected electrons are trapped by the charge trapping layer 40, such that the threshold voltage of the memory cell 30 would be adjusted under control. The top isolation layer 42, formed over the charge trapping layer 40, electrically isolates the conductive gate 44 from the charge trapping layer 40. The conductive gate 44 is formed over the top isolation layer 42. The memory cell 30 has a first side 41 near the source 34 and a second side 43 near the drain 36. The first side 41 and the second side 43 are independently programmable to store one bit of data, respectively. Therefore, the memory cell 30 stores two bits of data.

When the first side 41 is programmed, the conductive gate 44 is applied with a word line voltage, the source 34 is applied with a bit line voltage and the drain 36 is grounded. Voltages applied to the gate 44 and the source 34 create vertical electrical fields and lateral electrical fields and thus electrons are accelerated from the drain 36 to the source 34 along the channel of the memory cell 30. As the electrons move along the channel, some of the electrons gain sufficient energy to jump over the 5 potential barrier of the bottom isolation layer 38 and are trapped by the charge trapping layer 40 around the first side 41. Consequently, a threshold voltage of the first side 41 is increased, and the bit of the first side 41 is programmed from logic "1" to logic "0".

Similarly, when the second side 43 is programmed, the conductive gate 44 is applied with a word line voltage, the drain 36 is applied with a bit line voltage and the source 34 is grounded. By applying voltages to the gate 44 and the drain 36, electrons are trapped by the charge trapping layer 40 around the second side 43. Therefore, a threshold voltage of the second side 43 would be increased, and the bit of the second side 43 is programmed from logic "1" to logic "0".

The programming operation for the memory cell 30 would continue until the threshold voltage of the side under programming operation is higher than or equal to a predetermined level.

Moreover, when reading data from one side of the memory cell 30, the conductive gate 44 of the memory cell 30 is applied with a word-line voltage (e.g. 5V), the source/drain near the side under reading operation is grounded, and the source/drain near the other side is applied with a bit-line voltage (e.g. 1.6V).

Referring to FIG. 9, when reading the bit of the first side 41 of the memory cell 30, the gate 44, the source 34 and the drain 36 are applied with a word-line voltage, a ground voltage, and a bit-line voltage, respectively. If the word-line voltage applied to the gate 44 is higher than the threshold voltage of the first side 41, the channel between the source 34 and the drain 36 is turned on, and a current flows from the drain 36 through the source 34 and from a corresponding one bit line to a sense circuit (not shown). However, if the word-line voltage applied to the gate 44 is less than the threshold voltage of the first side 41, the channel between the source 34 and the drain 36 is turned off, and the sense circuit senses no current from the memory cell 30. Therefore, the sense circuit could determine logic state of the bit of first side 41 by detecting the current from the memory 30.

Similarly, when reading the bit of the second side 43 of the memory cell 30, the gate 44, the source 34 and the drain 36 are applied with a word-line voltage, a bit-line voltage, and a ground voltage, respectively. If the word-line voltage applied to the gate 44 is higher than the threshold voltage of the second side 43, the channel between the source 34 and the drain 36 is turned on, and a current flows from the source 34 through the drain 36 and from a corresponding one bit line to the sense circuit. However, if the word-line voltage applied to the gate 44 is less than the threshold voltage of the second side 43, the channel between the source 34 and the drain 36 is turned off, and the sense circuit senses no current from the memory cell 30.

The accessing method according to the present embodiment is for a memory with a number of memory cells, each of which is capable of storing two bits of data. The accessing method according to the present embodiment of the invention can effectively read the data stored in the memory even the distribution of memory cells with high-threshold-voltage state and that of the memory cells with low-threshold-voltage state are substantially overlapped with each other based on the information of whether a first cell current and a second cell current, which correspond with a first bit of data and a second bit of data respectively stored in a memory cell of the memory are substantially close to each other. Thus, in comparison with the conventional accessing method, the accessing method according to the present embodiment of the invention can effectively reduce the program shots and shorten the corresponding program time and reduce the voltage level of the reference voltage applied as the as a judging criterion of program states.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising:
    a memory array, comprising a memory cell for storing a first bit and a second bit;
    a first operation circuit for operating the first and the second bits with substantially the same initial threshold voltage state to a final threshold voltage state by applying a same number of operating shot; and
    a second operation circuit, comprising:
        a sense amplifier for sensing a first cell current and a second cell current corresponding to the first and the second bits respectively; and
        a control unit for determining a digital state of the first bit by comparing a reference data to a first delta current between the first cell current and the second cell current;
    wherein:
        the first delta current is obtained by subtracting the second cell current from the first cell current; and
        the control unit further compares the first cell current to a reference current.

2. The memory according to claim 1, wherein the control unit determines the first bit corresponds to a low-threshold-voltage state if the first delta current is greater than the reference data and the first cell current is not greater than the reference current.

3. The memory according to claim 1, wherein the control unit determines the first bit corresponds to the high-threshold-voltage state if the first delta current is not greater than the reference data and the first cell current is not greater than the reference current.

4. The memory according to claim 1, wherein the control unit determines the first bit corresponds to the low-threshold-voltage state if the first cell current is greater than the reference current.

5. The memory according to claim 1, wherein the control unit further determines a digital state of the second bit by comparing the second cell current to the reference current and by comparing the reference data to a second delta current, which is obtained by subtracting the first cell current from the second cell current.

6. The memory according to claim 5, wherein the control unit determines the second bit corresponds to a low-threshold-voltage state if the second delta current is greater than the reference data and the second cell current is not greater than the reference current.

7. The memory according to claim 5, wherein the control unit determines the second bit corresponds to the high-threshold-voltage state if the second delta current is not greater than the reference data and the second cell current is not greater than the reference current.

8. The memory according to claim 1, wherein the control unit determines the second bit corresponds to the low-threshold-voltage state if the second cell current is greater than the reference current.

9. The memory according to claim 1, wherein the first operation circuit further determines whether the first and the second bits both satisfy a verify standard, and the first operation circuit reprograms the first and the second bits when the first and the second bits do not both satisfy the verify standard.

10. The memory according to claim 1, wherein the control circuit comprises:
    a digital to analog converter, for converting the first cell current to a first digital value and converting the second cell current to a second digital value; and
    a comparator, for determining the first delta current by comparing the second digital value to the first digital value.

11. A memory, comprising:
    a memory cell for storing a first bit and a second bit;
    an operation circuit, for operating the first and the second bits with substantially a same initial threshold voltage state to a final threshold voltage state by applying a same number of operating shots, the operation circuit further determining whether the first and the second bits both satisfy a verify standard, and the operation circuit reprograms the first and the second bits when the first and the second bits do not both satisfy the verify standard;

a sense amplifier for sensing a first cell current and a second cell current corresponding to the first and the second bits, respectively, by applying a voltage on the memory cell; and a control unit for determining a digital state of the first bit by comparing a first reference current to the first cell current or by comparing a reference data to a first delta current between the first cell current and the second cell current.

12. The memory according to claim 11, wherein the first delta current is obtained by subtracting the second cell current from the first cell current.

13. The memory according to claim 12, wherein the control unit determines the first bit corresponds to a low-threshold-voltage state if the first delta current is greater than the reference data and the first cell current is not greater than the reference current.

14. The memory according to claim 12, wherein the control unit determines the first bit corresponds to the high-threshold-voltage state if the first delta current is not greater than the reference data and the first cell current is not greater than the reference current.

15. The memory according to claim 11, wherein the control unit determines the first bit corresponds to the low-threshold-voltage state if the first cell current is greater than the reference current.

16. The memory according to claim 11, wherein the control unit further determines a digital state of the second bit by comparing the second cell current to the reference current and comparing the reference data to a second delta current, which is obtained by subtracting the first cell current from the second cell current.

17. The memory according to claim 16, wherein the control unit determines the second bit corresponds to a low-threshold-voltage state if the second delta current is greater than the reference data and the second cell current is not greater than the reference current.

18. The memory according to claim 16, wherein the control unit determines the second bit corresponds to the high-threshold-voltage state if the second delta current is not greater than the reference data and the second cell current is not greater than the reference current.

19. The memory according to claim 11, wherein the control unit determines the second bit corresponds to the low-threshold-voltage state if the second cell current is greater than the reference current.

20. The memory according to claim 11, further comprising:

a digital to analog converter, for converting the first cell current to a first digital value and converting the second cell current to a second digital value; and a comparator, for determining the first delta current by comparing the second digital value to the first digital value.

* * * * *